US009542266B2

(12) United States Patent
Deguchi et al.

(10) Patent No.: US 9,542,266 B2
(45) Date of Patent: Jan. 10, 2017

(54) SEMICONDUCTOR INTEGRATED CIRCUIT AND METHOD OF PROCESSING IN SEMICONDUCTOR INTEGRATED CIRCUIT

(71) Applicant: FUJITSU LIMITED, Kawasaki-shi, Kanagawa (JP)

(72) Inventors: Chikahiro Deguchi, Toyohashi (JP); Yutaka Sekino, Toyohashi (JP); Yoshiki Okumura, Kosai (JP); Hiroaki Watanabe, Hamamatsu (JP); Naoki Maezawa, Toyohashi (JP); Hideyuki Negi, Hamamatsu (JP)

(73) Assignee: FUJITSU LIMITED, Kawasaki (JP)

( * ) Notice: Subject to any disclaimer, the term of this patent is extended or adjusted under 35 U.S.C. 154(b) by 130 days.

(21) Appl. No.: 14/287,635

(22) Filed: May 27, 2014

(65) Prior Publication Data

US 2014/0372837 A1      Dec. 18, 2014

(30) Foreign Application Priority Data

Jun. 13, 2013   (JP) .................................. 2013-124784

(51) Int. Cl.
  *G06F 11/10* (2006.01)
  *H04L 1/00* (2006.01)
  (Continued)

(52) U.S. Cl.
  CPC ............ *G06F 11/1032* (2013.01); *G06F 11/08* (2013.01); *G06F 11/1004* (2013.01);
  (Continued)

(58) Field of Classification Search
  CPC .. H03M 13/1171; H03M 13/09; H03M 13/05; H03M 13/1145; H03M 13/2903; G06F 11/108; G06F 11/14; G06F 11/1004; G06F 11/1032; G06F 11/1076; G06F 11/2236; G06F 11/08; G06F 11/1629; H04L 1/0066; H04L 1/0061; H04L 1/0063
  (Continued)

(56) References Cited

U.S. PATENT DOCUMENTS 4,414,669 A * 11/1983 Heckelman ............. G06F 11/10
  714/800
5,453,999 A *  9/1995 Michaelson ............ G06F 11/10
  714/805
(Continued)

FOREIGN PATENT DOCUMENTS

JP        5-88990      4/1993
JP        7-160587     6/1995
JP        2009-9570    1/2009

*Primary Examiner* — April Y Blair
*Assistant Examiner* — Sazzad Hossain
(74) *Attorney, Agent, or Firm* — Staas & Halsey LLP

(57) ABSTRACT

A semiconductor integrated circuit includes a combinational circuit to output a state value and a parity value, a first parity check circuit to perform a parity check based on the state value and the parity value stored in a first FF circuit and output a first parity error, a second parity check circuit to perform a parity check based on the state value and the parity value stored in a second FF circuit and output a second parity error, and a selector to, when the first parity error is not output but the second parity error is output, output the state value in the first FF circuit to the combinational circuit, and when the first parity error is output but the second parity error is not output, output the state value in the second FF circuit to the combinational circuit.

15 Claims, 6 Drawing Sheets

(51) Int. Cl.
    *G06F 11/22*     (2006.01)
    *H03M 13/09*     (2006.01)
    *H03M 13/11*     (2006.01)
    *H03M 13/29*     (2006.01)
    *G06F 11/08*     (2006.01)
    *G06F 11/14*     (2006.01)
    *H03M 13/05*     (2006.01)
    *G06F 11/16*     (2006.01)

(52) U.S. Cl.
    CPC ........ *G06F 11/108* (2013.01); *G06F 11/1076* (2013.01); *G06F 11/14* (2013.01); *G06F 11/1629* (2013.01); *G06F 11/2236* (2013.01); *H03M 13/05* (2013.01); *H03M 13/09* (2013.01); *H03M 13/1145* (2013.01); *H03M 13/1171* (2013.01); *H03M 13/2903* (2013.01); *H04L 1/0061* (2013.01); *H04L 1/0063* (2013.01); *H04L 1/0066* (2013.01)

(58) Field of Classification Search
    USPC ......... 708/530, 531; 714/52, 724, 758, 718, 714/799, 800, 801, 805, E11.114; 370/242, 351, 370/360, 363
    See application file for complete search history.

(56) References Cited

U.S. PATENT DOCUMENTS

| | | | |
|---|---|---|---|
| 7,710,859 B2* | 5/2010 | Christensen | H04L 1/0061 370/216 |
| 2007/0279264 A1* | 12/2007 | Nakagawa | G11B 20/1426 341/55 |
| 2008/0086667 A1* | 4/2008 | Chen | G01R 31/31716 714/731 |
| 2009/0006905 A1 | 1/2009 | Luick | |
| 2011/0175638 A1* | 7/2011 | Maeda | G01R 31/31856 324/762.01 |
| 2013/0010550 A1* | 1/2013 | Kim | G11C 7/02 365/189.15 |

\* cited by examiner

SEMICONDUCTOR INTEGRATED CIRCUIT AND METHOD OF PROCESSING IN SEMICONDUCTOR INTEGRATED CIRCUIT

CROSS-REFERENCE TO RELATED APPLICATION

This application is based upon and claims the benefit of priority of the prior Japanese Patent Application No. 2013-124784, filed on Jun. 13, 2013, the entire contents of which are incorporated herein by reference.

FIELD

The embodiment discussed herein is related to a semiconductor integrated circuit and a method of processing in the semiconductor integrated circuit.

BACKGROUND

Japanese Laid-open Patent Publication No. 2009-9570 discusses a cascaded delayed execution pipeline to maintain a precise machine state. A delay of one or more cycles is inserted prior to a write back stage of each pipeline to facilitate error detection and recovery. Since a precise machine state is maintained, error detection and recovery mechanisms are built directly into register files of a system. If an error is detected, execution of an instruction associated with the error and all subsequent instructions is restarted.

Japanese Laid-open Patent Publication No. 7-160587 discusses a redundant memory device. The memory device includes a parity circuit configured to detect a single-bit error when data is read, a selecting circuit configured to, when a single-bit error is detected, select and use data in a normal memory unit included in the redundant memory device in order to continue a process, and a duplicate data comparing circuit configured to detect an error of two or more bits. In an initial inspection, if a fixed failure of two or more bits associated with one system included in the redundant memory device is detected, an address in the memory unit associated with the failure is indicated as invalid or valid. The duplicate data comparing circuit is disabled in response to an address invalid signal. Data in a system having addresses which are indicated as valid by a unit configured to indicate an address as invalid or valid and in which any parity error has not been detected is indicated to be used.

Japanese Laid-open Patent Publication No. 5-88990 discusses a redundant memory device which avoids the occurrence of a two-bit error or the like due to accumulation of soft errors in memory units and thus exhibits high reliability. A given time interval is set in a timer. A bus arbiter receives a check request output from the timer at given time intervals and protects first and second memory units included in the redundant memory device against access from a central processing unit (CPU).

An address generator is activated in response to the check request from the timer and generates addresses to scan all of areas in the first and second memory units. A parity check unit checks the parity of data read from each address of the first and second memory units. When the parity check unit detects an error, an error correcting unit writes correct data into an area in the memory unit associated with the detected error.

If a bit error occurs due to a soft error or the like in a memory unit in a state machine, the bit error may be detected by a parity check but the error is not corrected. Disadvantageously, an operation of the state machine is not continued after the occurrence of the error.

In the redundant memory device discussed in Japanese Laid-open Patent Publication No. 7-160587, a normally operating memory unit is selected and used. Disadvantageously, if an error occurs in this memory unit, the process is not continued.

In the redundant memory device discussed in Japanese Laid-open Patent Publication No. 5-88990, the first and second memory units are arranged for redundant memory and the parity check and error correction are performed at given time intervals. If an error occurs between parity check cycles, the memory unit associated with the error remains in an erroneous state until the next parity check. Disadvantageously, values in the memory unit are not correct at any time. If data is read from the memory unit during the period between the occurrence of the error and the correction thereof, an abnormal value may be processed.

SUMMARY

According to an aspect of the invention, A semiconductor integrated circuit includes: a first-combinational-circuit to output a state-value depending on an input signal and a parity-value of the state-value which are stored by a first-flip-flop-circuit; a first-parity-check-circuit to perform a parity check based on the state-value and the parity-value and output a first-parity-error; a second-flip-flop-circuit to store the state-value and the parity-value output by the first-combinational-circuit; a second-parity-check-circuit to perform a parity check based on the state-value and the parity-value stored in the second-flip-flop-circuit and output a second-parity-error; and a selector to, when the first-parity-error is not output but the second-parity-error is output, output the state-value stored in the first-flip-flop-circuit to the first-combinational-circuit, and when the first-parity-error is output but the second-parity-error is not output, output the state-value stored in the second-flip-flop-circuit to the first-combinational-circuit, wherein the first-combinational-circuit outputs a current state-value depending on the state-value output by the selector and the input signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Figure 1:
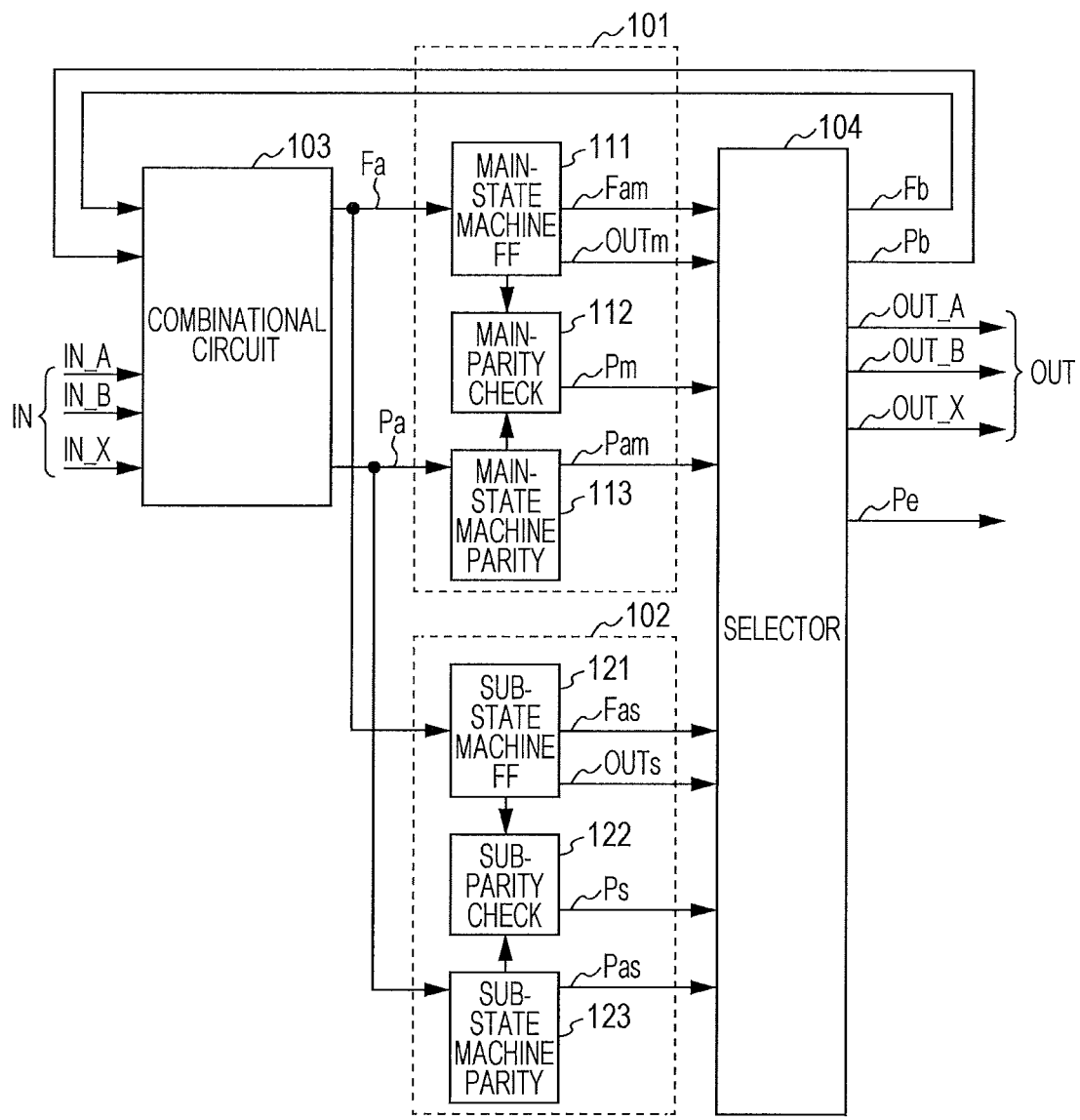
FIG. 1 is a diagram illustrating an exemplary configuration of a semiconductor integrated circuit according to an embodiment.

FIG. 1 illustrates an exemplary configuration of a semiconductor integrated circuit according to an embodiment. The semiconductor integrated circuit is a state machine and includes a first combinational circuit 103, a main-state machine 101, a sub-state machine 102, and a selector 104. The semiconductor integrated circuit receives an input signal IN and outputs an output signal OUT and a parity error Pe. The input signal IN includes input signals IN_A to IN_X of multiple bits. The output signal OUT includes output signals OUT_A to OUT_X of multiple bits.

The first combinational circuit 103 outputs a multi-bit state value Fa depending on a combination of signal elements of the multi-bit input signal IN and a single-bit parity value Pa to each of the main-state machine 101 and the sub-state machine 102. For an odd parity, the first combinational circuit 103 outputs the parity value Pa having a value of 1, or at logic 1 when the multi-bit state value Fa includes an even number of bits at logic 1, and outputs the parity value Pa at logic 0 when the multi-bit state value Fa includes an odd number of bits at logic 1. For an even parity, the first combinational circuit 103 outputs the parity value Pa at logic 1 when the multi-bit state value Fa includes an odd number of bits at logic 1, and outputs the parity value Pa at logic 0 when the multi-bit state value Fa includes an even number of bits at logic 1.

The main-state machine 101 includes a main-state machine flip-flop (FF) circuit 111, a main-parity check circuit 112, and a main-state machine parity FF circuit 113. The main-state machine FF circuit 111 and the main-state machine parity FF circuit 113 are first FF circuits. The main-state machine FF circuit 111 receives the multi-bit state value Fa and outputs a multi-bit state value Fam and a multi-bit output signal OUTm.

Figure 2:
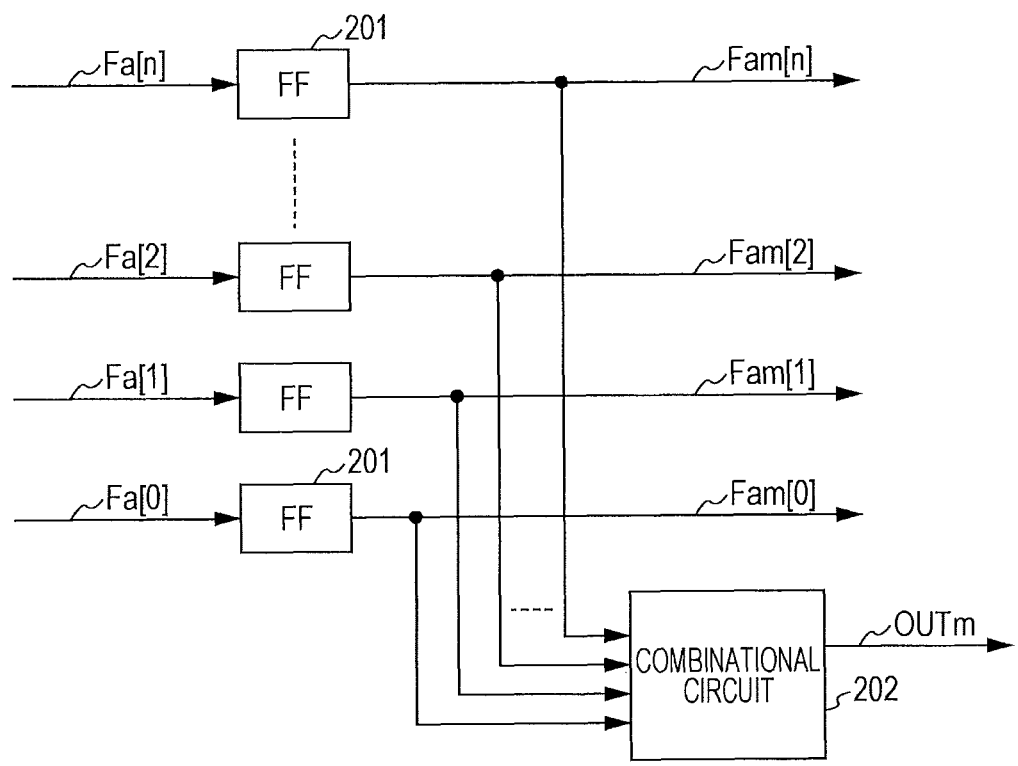
FIG. 2 is a diagram illustrating an exemplary configuration of a main-state machine flip-flop circuit in FIG. 1.

FIG. 2 illustrates an exemplary configuration of the main-state machine FF circuit 111 in FIG. 1. Multi-bit state values Fa[0] to Fa[n] correspond to the multi-bit state value Fa in FIG. 1. Multi-bit state values Fam[0] to Fam[n] correspond to the multi-bit state value Fam in FIG. 1. The main-state machine FF circuit 111 includes a plurality of FFs 201 and a second combinational circuit 202. The FFs 201 latch and store the multi-bit state values Fa[0] to Fa[n] and output stored state values as multi-bit state values Fam[0] to Fam[n] in synchronization with a clock signal CLK (refer to FIG. 5). The second combinational circuit 202 outputs the multi-bit output signal OUTm depending on a combination of the multi-bit state values Fam[0] to Fam[n]. The output signal OUTm includes a memory write enable signal.

Figure 5:
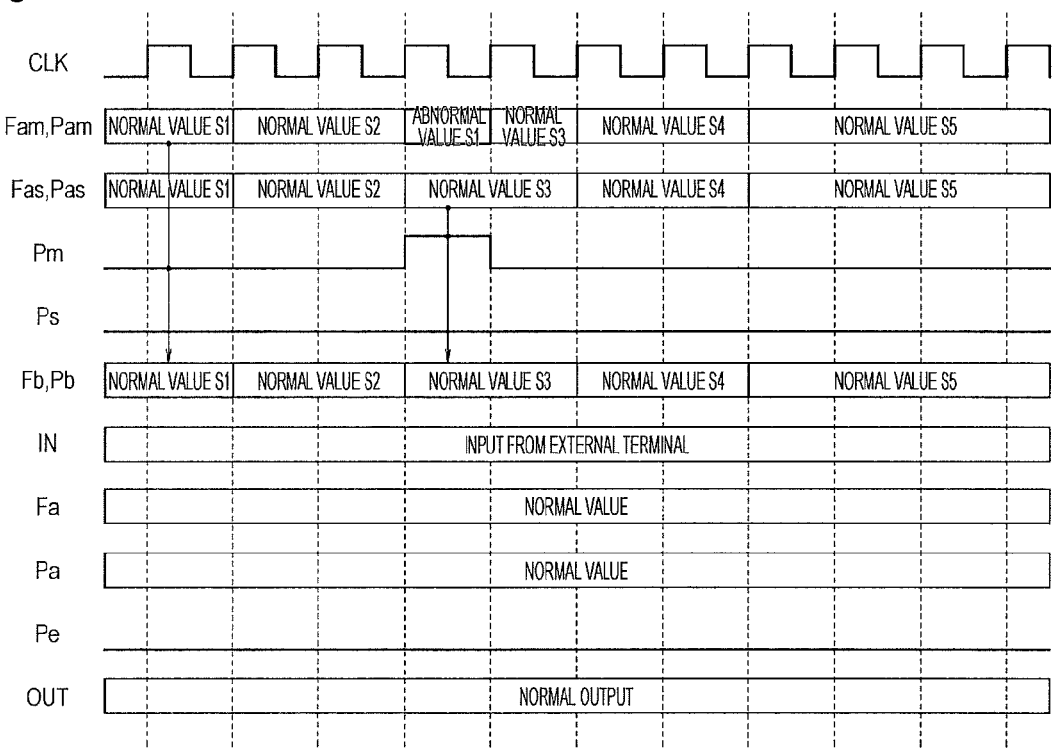
FIG. 5 is a timing chart illustrating an exemplary operation of the semiconductor integrated circuit of FIG. 1.

Referring to FIG. 1, the main-state machine parity FF circuit 113 latches and stores the single-bit parity value Pa and outputs a stored parity value as a single-bit parity value Pam in synchronization with the clock signal CLK (refer to FIG. 5).

The main-parity check circuit 112, serving as a first parity check circuit, performs a parity check based on the multi-bit state value Fam stored in the main-state machine FF circuit 111 and the single-bit parity value Pam stored in the main-state machine parity FF circuit 113. When detecting an error, the main-parity check circuit 112 outputs a first parity error Pm at logic 1. For the odd parity, the main-parity check circuit 112, serving as an exclusive-OR circuit, outputs the first parity error Pm at logic 0 when detecting no error, that is, when the multi-bit state value Fam and the single-bit parity value Pam include an odd number of bits at logic 1, and outputs the first parity error Pm at logic 1 when detecting an error, that is, when the multi-bit state value Fam and the single-bit parity value Pam include an even number of bits at logic 1. On the other hand, for the even parity, the main-parity check circuit 112 outputs the first parity error Pm at logic 0 when detecting no error, that is, when the multi-bit state value Fam and the single-bit parity value Pam include an even number of bits at logic 1, and outputs the first parity error Pm at logic 1 when detecting an error, that is, when the multi-bit state value Fam and the single-bit parity value Pam include an odd number of bits at logic 1.

The value of the multi-bit state value Fam stored in the main-state machine FF circuit 111 or the single-bit parity value Pam stored in the main-state machine parity FF circuit 113 may be logically inverted due to a bit error caused by a soft error or the like. Soft errors include a temporary error caused, for example, by radiation, such as a cosmic ray, striking the FF circuit 111 or 113. The striking results in altering the amount of charge stored in a memory cell of the FF circuit 111 or 113 and altering a stored value. A single-bit value in the multi-bit state value Fam and the single-bit parity value Pam may be altered by a bit error caused by a soft error or the like. In this case, the main-parity check circuit 112 detects an error and outputs the first parity error Pm at logic 1.

The sub-state machine 102 includes a sub-state machine FF circuit 121, a sub-parity check circuit 122, and a sub-state machine parity FF circuit 123. The sub-state machine FF circuit 121 and the sub-state machine parity FF circuit 123 are second FF circuits. The sub-state machine FF circuit 121 receives the multi-bit state value Fa and outputs a multi-bit state value Fas and a multi-bit output signal OUTs.

Like the main-state machine FF circuit 111 of FIG. 2, the sub-state machine FF circuit 121 includes a plurality of FFs 201 and a third combinational circuit 202. The combinational circuit 202 in the sub-state machine FF circuit 121 has the same configuration as that of the combinational circuit 202 in the main-state machine FF circuit 111. The FFs 201 latch and store the multi-bit state values Fa[0] to Fa[n] and output stored state values as multi-bit state values Fas[0] to Fas[n] in synchronization with the clock signal CLK (refer to FIG. 5). The third combinational circuit 202 outputs the multi-bit output signal OUTs depending on a combination of the multi-bit state values Fas[0] to Fas[n]. The output signal OUTs includes a memory write enable signal.

Referring to FIG. 1, the sub-state machine parity FF circuit 123 latches and stores the single-bit parity value Pa and outputs a stored parity value as a single-bit parity value Pas in synchronization with the clock signal CLK (refer to FIG. 5).

The sub-parity check circuit 122, serving as a second parity check circuit, performs a parity check based on the multi-bit state value Fas stored in the sub-state machine FF circuit 121 and the single-bit parity value Pas stored in the sub-state machine parity FF circuit 123. When detecting an error, the sub-parity check circuit 122 outputs a second parity error Ps at logic 1. For the odd parity, the sub-parity check circuit 122, serving as an exclusive-OR circuit, outputs the second parity error Ps at logic 0 when detecting no error, that is, when the multi-bit state value Fas and the single-bit parity value Pas include an odd number of bits at logic 1, and outputs the second parity error Ps at logic 1 when detecting an error, that is, when the multi-bit state value Fas and the single-bit parity value Pas include an even number of bits at logic 1. On the other hand, for the even parity, the sub-parity check circuit 122 outputs the second parity error Ps at logic 0 when detecting no error, that is, when the multi-bit state value Fas and the single-bit parity value Pas include an even number of bits at logic 1, and outputs the second parity error Ps at logic 1 when detecting an error, that is, when the multi-bit state value Fas and the single-bit parity value Pas include an odd number of bits at logic 1. A single-bit value in the multi-bit state value Fas and the single-bit parity value Pas may be altered due to a bit error caused by a soft error or the like. In this case, the sub-parity check circuit 122 detects an error and outputs the second parity error Ps at logic 1.

The selector 104 receives the multi-bit state value Fam, the multi-bit output signal OUTm, the first parity error Pm, and the single-bit parity value Pam from the main-state machine 101 and further receives the multi-bit state value Fas, the multi-bit output signal OUTs, the second parity error Ps, and the single-bit parity value Pas from the sub-state machine 102. The selector 104 outputs a multi-bit state value Fb and a single-bit parity value Pb to the first combinational circuit 103 and outputs the multi-bit output signal OUT and the parity error Pe to the outside of the semiconductor integrated circuit.

Figure 3:
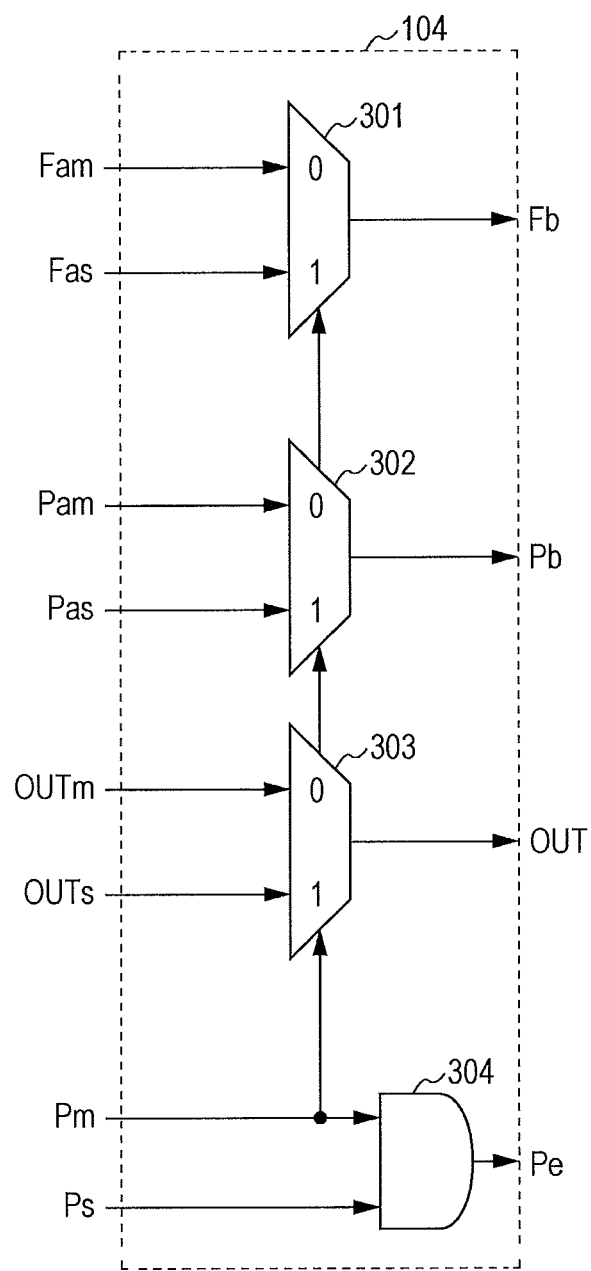
FIG. 3 is a diagram illustrating an exemplary configuration of a selector in FIG. 1.

FIG. 3 illustrates an exemplary configuration of the selector 104 in FIG. 1. The selector 104 includes selector elements 301 to 303 and an AND circuit 304. When the first parity error Pm is at logic 0, this means that the main-state machine 101 is in a non-erroneous state, or normal state. Accordingly, the selector elements 301 to 303 select the multi-bit state value Fam, the single-bit parity value Pam, and the multi-bit output signal OUTm of the main-state machine 101, respectively, and then output them as the multi-bit state value Fb, the single-bit parity value Pb, and the multi-bit output signal OUT, respectively. On the other hand, when the first parity error Pm is at logic 1, this means that the main-state machine 101 is in an erroneous state. The selector elements 301 to 303 select the multi-bit state value Fas, the single-bit parity value Pas, and the multi-bit output signal OUTs of the sub-state machine 102, respectively, and then output them as the multi-bit state value Fb, the single-bit parity value Pb, and the multi-bit output signal OUT, respectively.

When both the parity errors Pm and Ps are at logic 0, this means that both the main-state machine 101 and the sub-state machine 102 are in the non-erroneous state. The selector elements 301 to 303 may select the signals output from either of the main-state machine 101 and the sub-state machine 102.

When both the parity errors Pm and Ps are at logic 1, this means that both the main-state machine 101 and the sub-state machine 102 are in the erroneous state. The selector elements 301 to 303 may select the signals output from either of the main-state machine 101 and the sub-state machine 102.

As described above, when the first parity error Pm is at logic 0 and the second parity error Ps is at logic 1, the selector 104 selects the multi-bit state value Fam, the single-bit parity value Pam, and the multi-bit output signal OUTm and outputs them as the multi-bit state value Fb, the single-bit parity value Pb, and the multi-bit output signal OUT.

When the first parity error Pm is at logic 1 and the second parity error Ps is at logic 0, the selector 104 selects the multi-bit state value Fas, the single-bit parity value Pas, and the multi-bit output signal OUTs and outputs them as the multi-bit state value Fb, the single-bit parity value Pb, and the multi-bit output signal OUT.

When the first parity error Pm is at logic 0 and the second parity error Ps is at logic 0, the selector 104 selects the signals output from either the main-state machine 101 or the sub-state machine 102 and outputs them as the multi-bit state value Fb, the single-bit parity value Pb, and the multi-bit output signal OUT.

When the first parity error Pm is at logic 1 and the second parity error Ps is at logic 1, the selector 104 selects the signals output from either the main-state machine 101 or the sub-state machine 102 and outputs them as the multi-bit state value Fb, the single-bit parity value Pb, and the multi-bit output signal OUT.

The AND circuit 304, serving as a parity error output circuit, outputs the AND of the first parity error Pm and the second parity error Ps as the parity error Pe. Specifically, the AND circuit 304 outputs the parity error Pe at logic 1 when the first parity error Pm is at logic 1 and the second parity error Ps is at logic 1, and outputs the parity error Pe at logic 0 except when both the first parity error Pm and the second parity error Ps are at logic 1. When the parity error Pe is at logic 1, an error is present. When the parity error Pe is at logic 0, no error is present.

The first combinational circuit 103 outputs the current multi-bit state value Fa and the current single-bit parity value Pa to each of the main-state machine 101 and the sub-state machine 102 depending on the previous multi-bit state value Fb, the previous parity value Pb, and the input signal IN output by the selector 104.

For example, if a soft error or the like causes a bit error in the multi-bit state value Fam of the main-state machine FF circuit 111, the selector 104 selects the non-erroneous multi-bit state value Fas of the sub-state machine FF circuit 121 and outputs it to the first combinational circuit 103. Since the first combinational circuit 103 receives the correct previous multi-bit state value Fb, the first combinational circuit 103 outputs the correct and current multi-bit state value Fa to each of the main-state machine FF circuit 111 and the sub-state machine FF circuit 121. Thus, the main-state machine FF circuit 111 and the sub-state machine FF circuit 121 may store the correct and current multi-bit state value Fa as the multi-bit state value Fam and the multi-bit state value Fas, respectively. In other words, the soft error in the main-state machine FF circuit 111 is corrected, so that the main-state machine FF circuit 111 returns to the normal state.

Similarly, if a soft error or the like causes a bit error in the multi-bit state value Fas of the sub-state machine FF circuit 121, the selector 104 selects the non-erroneous multi-bit state value Fam of the main-state machine FF circuit 111 and outputs it to the first combinational circuit 103. Since the first combinational circuit 103 receives the correct previous multi-bit state value Fb, the first combinational circuit 103 outputs the correct and current multi-bit state value Fa to each of the main-state machine FF circuit 111 and the sub-state machine FF circuit 121. Thus, the main-state machine FF circuit 111 and the sub-state machine FF circuit 121 may store the correct and current multi-bit state value Fa as the multi-bit state value Fam and the multi-bit state value Fas, respectively. In other words, the soft error in the sub-state machine FF circuit 121 is corrected, so that the sub-state machine FF circuit 121 returns to the normal state.

For example, assuming that the selector 104 does not feed back the correct multi-bit state value Fb to the first combinational circuit 103, if a soft error occurs in the main-state machine FF circuit 111, the main-state machine FF circuit 111 would not recover from the erroneous state. After that, if a soft error occurs in the sub-state machine FF circuit 121, both the main-state machine FF circuit 111 and the sub-state machine FF circuit 121 would be in the erroneous state and fail to operate normally.

According to this embodiment, the selector 104 feeds back the correct multi-bit state value Fb to the first combinational circuit 103. Accordingly, if a soft error occurs in the main-state machine FF circuit 111, the main-state machine FF circuit 111 may return to the normal state. After that, if a soft error occurs in the sub-state machine FF circuit 121, the normal operation may be maintained because the main-state machine FF circuit 111 has returned to the normal state.

When both the first parity error Pm and the second parity error Ps are at logic 1, both the main-state machine 101 and the sub-state machine 102 are in the erroneous state. The main-state machine 101 and the sub-state machine 102 do not recover. Consequently, the parity error Pe goes to logic 1. The selector 104 outputs the erroneous multi-bit state value Fb and the single-bit parity value Pb to the first combinational circuit 103, so that the following operation is erroneous and does not recover.

The first combinational circuit 103 may generate the current multi-bit state value Fa based on the input signal IN and the previous multi-bit state value Fb and generate the current single-bit parity value Pa based typically on the current multi-bit state value Fa. In this case, however, after the parity error Pe changes to logic 1, the main-parity check circuit 112 and the sub-parity check circuit 122 would output the first parity error Pm at logic 0 and the second parity error Ps at logic 0, respectively. Consequently, the parity error Pe would return from logic 1 to logic 0. As described above, after the parity error Pe changes to logic 1, the main-state machine 101 and the sub-state machine 102 do not recover and remain in the erroneous state. If the parity error Pe returns from logic 1 to logic 0, however, the main-state machine 101 and the sub-state machine 102 are falsely recognized as being in the non-erroneous state. This may lead to erroneous processing. Desirably, therefore, the parity error Pe has a function of remaining at logic 1 after changing to logic 1. This function will be described below.

The first combinational circuit 103 generates and outputs the current parity value Pa based on the previous parity value Pb output from the selector 104. A method of generating the parity value Pa will be described below.

If a remainder left when the number of bits at logic 1 in the multi-bit state value Fa to be output is divided by two is identical to that left when the number of bits at logic 1 in the previous multi-bit state value Fb output by the selector 104 is divided by two, the first combinational circuit 103 outputs the previous single-bit parity value Pb output by the selector 104 as the current single-bit parity value Pa.

If the remainder left when the number of bits at logic 1 in the multi-bit state value Fa to be output is divided by two is different from that left when the number of bits at logic 1 in the multi-bit state value Fb output by the selector 104 is divided by two, the first combinational circuit 103 outputs a logically inverted value of the single-bit parity value Pb output by the selector 104 as the current single-bit parity value Pa.

Specifically, when the multi-bit state value Fa to be output includes an odd number of bits at logic 1 and the previous multi-bit state value Fb output by the selector 104 includes an odd number of bits at logic 1, the first combinational circuit 103 outputs the previous single-bit parity value Pb output by the selector 104 as the current single-bit parity value Pa.

When the multi-bit state value Fa to be output includes an even number of bits at logic 1 and the previous multi-bit state value Fb output by the selector 104 includes an even number of bits at logic 1, the first combinational circuit 103 outputs the previous single-bit parity value Pb output by the selector 104 as the current single-bit parity value Pa.

When the multi-bit state value Fa to be output includes an odd number of bits at logic 1 and the previous multi-bit state value Fb output by the selector 104 includes an even number of bits at logic 1, the first combinational circuit 103 outputs the logically inverted value of the previous single-bit parity value Pb output by the selector 104 as the current single-bit parity value Pa.

When the multi-bit state value Fa to be output includes an even number of bits at logic 1 and the previous multi-bit state value Fb output by the selector 104 includes an odd number of bits at logic 1, the first combinational circuit 103 outputs the logically inverted value of the previous single-bit parity value Pb output by the selector 104 as the current single-bit parity value Pa.

Consequently, when both the first parity error Pm and the second parity error Ps are at logic 1, the main-parity check circuit 112 outputs the first parity error Pm at logic 1 next time and the sub-parity check circuit 122 outputs the second parity error Ps at logic 1 next time.

In other words, after the parity error Pe goes to logic 1, the main-parity check circuit 112 and the sub-parity check circuit 122 may continue to output the first parity error Pm at logic 1 and the sub-parity check circuit 122 may continue to output the second parity error Ps at logic 1. Consequently, the parity error Pe does not return from logic 1 to logic 0, but remains at logic 1. Thus, the main-state machine 101 and the sub-state machine 102 may be correctly recognized as remaining in the erroneous state.

Figure 4:
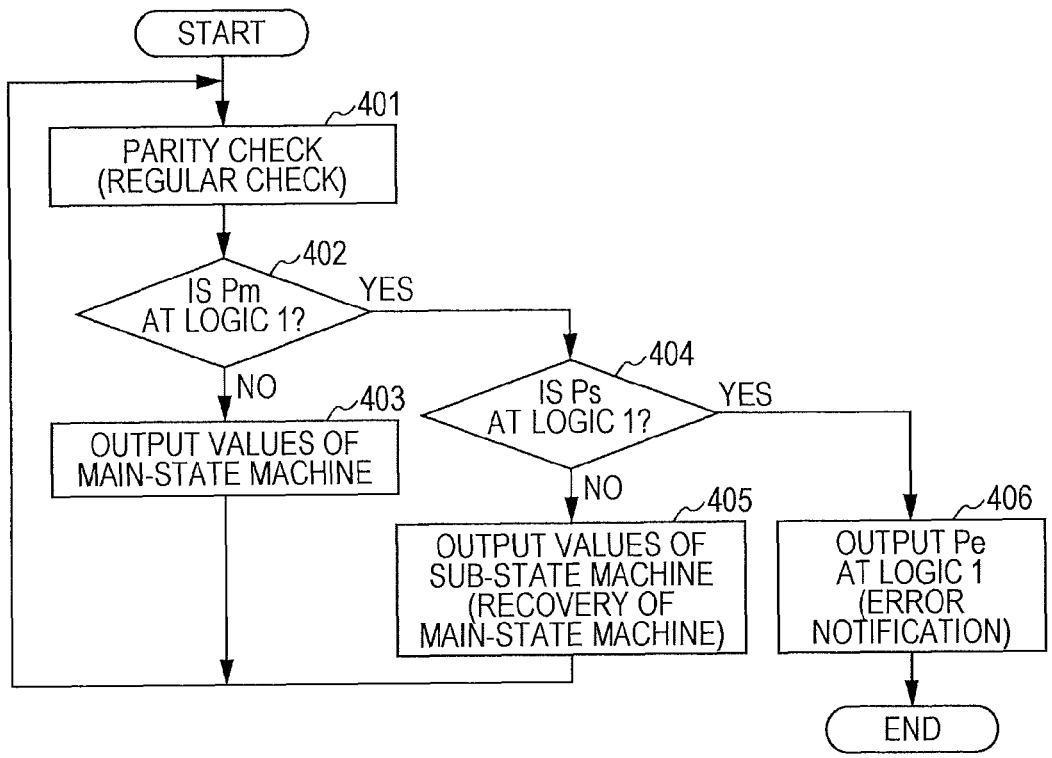
FIG. 4 is a flowchart depicting a method of processing in the semiconductor integrated circuit of FIG. 1.

FIG. 4 is a flowchart depicting a method of processing in the semiconductor integrated circuit of FIG. 1. In step 401, the main-parity check circuit 112 and the sub-parity check circuit 122 each perform the parity check. In step 402, the selector 104 determines whether the first parity error Pm is at logic 1. If the first parity error Pm is at logic 1, the main-state machine 101 is in the erroneous state. Accordingly, the method proceeds to step 404. If the first parity error Pm is at logic 0, the main-state machine 101 is in the non-erroneous state. Accordingly, the method proceeds step 403. In step 403, the selector 104 selects and outputs the multi-bit state value Fam, the single-bit parity value Pam, and the multi-bit output signal OUTm of the main-state machine 101. The method then returns to step 401.

In step 404, the selector 104 determines whether the second parity error Ps is at logic 1. If the second parity error Ps is at logic 1, the sub-state machine 102 is in the erroneous state. Accordingly, the method proceeds to step 406. If the second parity error Ps is at logic 0, the sub-state machine 102 is in the non-erroneous state. Accordingly, the method proceeds to step 405. In step 405, the selector 104 selects and outputs the multi-bit state value Fas, the single-bit parity value Pas, and the multi-bit output signal OUTs of the sub-state machine 102. Thus, the main-state machine 101 returns to the normal state. After that, the method returns to step 401. In step 406, the selector 104 outputs the parity error Pe at logic 1 to provide error notification to the outside.

FIG. 5 is a timing chart illustrating an exemplary operation of the semiconductor integrated circuit of FIG. 1. The semiconductor integrated circuit operates in synchronization with the clock signal CLK. The main-state machine 101 outputs a normal value S1 as the multi-bit state value Fam and outputs the single-bit parity value Pa which is normal. The sub-state machine 102 outputs a normal value S1 as the multi-bit state value Fas and outputs the single-bit parity value Pas which is normal. The first parity error Pm is at logic 0 and the second parity error Ps is also at logic 0. The selector 104 selects the multi-bit state value Fam (normal value S1) and the single-bit parity value Pam of the main-state machine 101 and outputs them as the multi-bit state value Fb (normal value S1) and the single-bit parity value Pb. The parity error Pe is at logic 0.

Subsequently, the main-state machine 101 outputs a normal value S2 as the multi-bit state value Fam and outputs the single-bit parity value Pam which is normal. The sub-state machine 102 outputs a normal value S2 as the multi-bit state value Fas and outputs the single-bit parity value Pas which is normal. The first parity error Pm is at logic 0 and the second parity error Ps is also at logic 0. The selector 104 selects the multi-bit state value Fam (normal value S2) and the single-bit parity value Pam of the main-state machine 101 and outputs them as the multi-bit state value Fb (normal value S2) and the single-bit parity value Pb. The parity error Pe is at logic 0.

Then, the main-state machine 101 outputs an abnormal value S1, caused by a soft error or the like, as the multi-bit state value Fam and outputs the single-bit parity value Pam which is normal. The sub-state machine 102 outputs a normal value S3 as the multi-bit state value Fas and outputs the single-bit parity value Pas which is normal. The first parity error Pm is at logic 1 and the second parity error Ps is at logic 0. The selector 104 selects the multi-bit state value Fas (normal value S3) and the single-bit parity value Pas of the sub-state machine 102 in the normal state and outputs them as the multi-bit state value Fb (normal value S3) and the single-bit parity value Pb. The parity error Pe is at logic 0.

Subsequently, the main-state machine 101 returns to the normal state, outputs a normal value S4 as the multi-bit state value Fam, and outputs the single-bit parity value Pam which is normal. The sub-state machine 102 outputs a normal value S4 as the multi-bit state value Fas and outputs the single-bit parity value Pas which is normal. The first parity error Pm is at logic 0 and the second parity error Ps is also at logic 0. The selector 104 selects the multi-bit state value Fam (normal value S4) and the single-bit parity value Pam of the main-state machine 101 and outputs them as the multi-bit state value Fb (normal value S4) and the single-bit parity value Pb. The parity error Pe is at logic 0.

Then, the main-state machine 101 outputs a normal value S5 as the multi-bit state value Fam and outputs the single-bit parity value Pam which is normal. The sub-state machine 102 outputs a normal value S5 as the multi-bit state value Fas and outputs the single-bit parity value Pas which is normal. The first parity error Pm is at logic 0 and the second parity error Ps is also at logic 0. The selector 104 selects the multi-bit state value Fam (normal value S5) and the single-bit parity value Pam of the main-state machine 101 and outputs them as the multi-bit state value Fb (normal value S5) and the single-bit parity value Pb. The parity error Pe is at logic 0.

Figure 6:
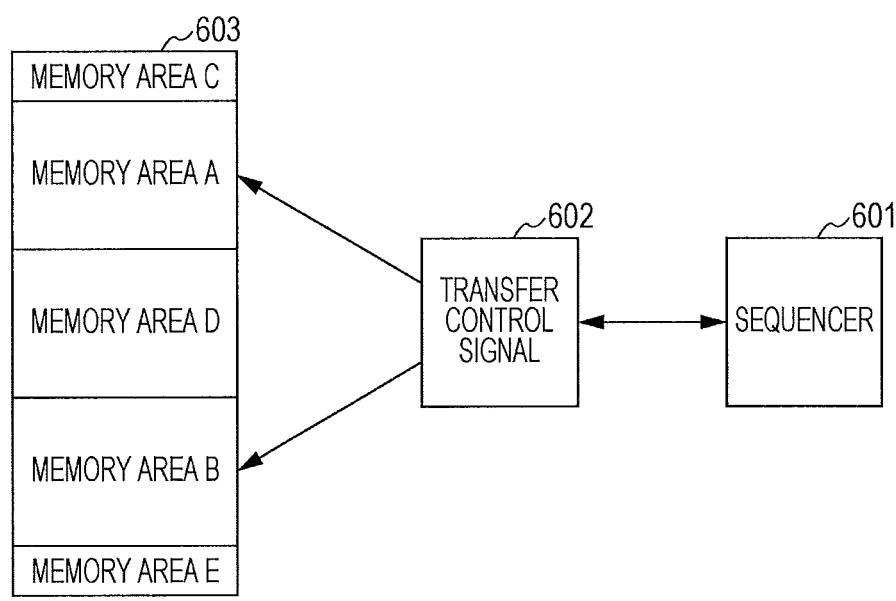
FIG. 6 is a diagram illustrating an exemplary application of the semiconductor integrated circuit of FIG. 1 to a sequencer.

FIG. 6 illustrates an exemplary application of the semiconductor integrated circuit of FIG. 1 to a sequencer 601. The sequencer 601 may transfer data from a memory area A to a memory area B in a memory 603 using a transfer control signal 602. The sequencer 601 corresponds to the semiconductor integrated circuit of FIG. 1. The transfer control signal 602 corresponds to the output signal OUT in FIG. 1.

Assuming that the sequencer 601 does not include the sub-state machine 102, if the sequencer 601 enters an erroneous state, a manager would reset the sequencer 601 to stop the transfer upon recognizing the erroneous state. During the erroneous state of the sequencer 601, the output signal 602 of the sequencer 601 would be abnormal. Accordingly, correct data may fail to be transferred from the memory area A to the memory area B. Additionally, abnormal data may be written into memory areas C, D, and E which are not associated with the transfer. The manager would check each of the areas A to E which the sequencer 601 may access in order to determine whether the area functions normally. Such a check includes many tasks. At completion of the check, the manager would allow the sequencer 601 to restart the transfer.

The sequencer 601 having the configuration of the semiconductor integrated circuit of FIG. 1 may recover automatically if an error occurs. Accordingly, the transfer is completed normally. Additionally, it is unlikely that abnormal data will be written into the memory areas C, D, and E which are not associated with the transfer. Thus, it is unnecessary for the manager to check the memory areas.

Furthermore, the state machine of FIG. 1 may be included in a server connected to a plurality of personal computers in a system. In this case, the state machine may control data transfer between the personal computers.

Assuming that the state machine does not include the sub-state machine 102, if an error occurs in the state machine during data transfer from a first personal computer to a second personal computer through the server after startup of the server and the personal computers, it is difficult to continue the transfer because the state machine does not recover automatically. The transfer, accordingly, may be interrupted. After the interruption, the manager determines a location of the error and, as appropriate, replaces a faulty part, for example, a circuit board on which the state machine is mounted. After that, the server is restarted, a location of data whose transfer has been interrupted is determined, and the transfer of data is restarted from the determined location. The transfer may be completed. If the error is caused by a soft error, it may be unnecessary to replace the circuit board. In such a case, however, the server may be restarted.

If a bit error caused by a soft error or the like occurs in the state machine having the configuration of FIG. 1, a process is not interrupted because the state machine recovers automatically. Thus, transfer may be completed smoothly. Advantageously, if an error occurs in the state machine, various operations, such as interruption of transfer, examination, replacement of the circuit board, restart of the server, examination, and restart of the transfer, may be omitted. Thus, the efficiency of transfer is significantly increased.

As described above, according to the embodiment, if the first parity error Pm or the second parity error Ps at logic 1 is output due to a soft error or the like, the selector 104 outputs the correct state value Fb to the first combinational circuit 103. Advantageously, the state value stored in the main-state machine 101 and the sub-state machine 102 is corrected to a correct value, so that the normal operation may be continued.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A semiconductor integrated circuit comprising:
a first combinational circuit to output a state value depending on an input signal and output a parity value of the state value;
a first flip-flop circuit to store the state value and the parity value output by the first combinational circuit and output a state value, a first parity value, and a first output value;
a first parity check circuit to perform a parity check based on the state value and the parity value stored in the first flip-flop circuit and output a first parity error when detecting an error;
a second flip-flop circuit, coupled to the first combinational circuit in parallel with the first flip-flop circuit, to store the state value and the parity value output by the first combinational circuit and output a second state value, a second parity value, and a second output value;
a second parity check circuit to perform a parity check based on the state value and the parity value stored in the second flip-flop circuit and output a second parity error when detecting an error; and
a selector to, when the first parity error is not output but the second parity error is output, output the first state value to the first combinational circuit, and when the first parity error is output but the second parity error is not output, output the second state value to the first combinational circuit,
wherein the first combinational circuit outputs a current state value depending on the state value output by the selector and the input signal, and
wherein the selector includes
a first selector that is coupled to the first flip-flop circuit, the second flip-flop circuit, and the first parity check circuit, selects one of the first state value and the second state value based on the first parity error output from the first parity check circuit and outputs a selected state value to the first combinational circuit,
a second selector that is coupled to the first flip-flop circuit, the second flip-flop circuit, and the first parity check circuit, selects one of the first parity value and the second parity value based on the first parity error output from the first parity check circuit and outputs a selected parity value to the first combinational circuit,
a third selector that is coupled to the first flip-flop circuit, the second flip-flop circuit, and the first parity check circuit and selects one of the first output value and the second output value based on the first parity error output from the first parity check circuit, and
an AND circuit that is coupled to the first parity check circuit and the second parity check circuit and outputs a result of an AND operation of the first parity error and the second parity error.

2. The semiconductor integrated circuit according to claim 1, wherein when the first parity error and the second parity error are not output, the first selector outputs the first state value or the second state value to the first combinational circuit.

3. The semiconductor integrated circuit according to claim 1, wherein when the first parity error and the second parity error are output, the first selector outputs the first state value or the second state value to the first combinational circuit.

4. The semiconductor integrated circuit according to claim 1,
wherein the AND circuit functions as a parity error output circuit to output a parity error when the first parity error and the second parity error are output.

5. The semiconductor integrated circuit according to claim 1,
wherein the second selector outputs the first parity value to the first combinational circuit when the second parity error is output, and outputs the second parity value to the first combinational circuit when the first parity error is output, and
wherein the first combinational circuit generates and outputs a current parity value based on one of the first parity value and the second parity value that is output by the second selector.

6. The semiconductor integrated circuit according to claim 5,
wherein when a remainder left when a number of bits at logic 1 in the state value to be output by the first combinational circuit is divided by two is identical to a remainder left when the number of bits at logic 1 in one of the first state value and the second state value that is output by the first selector is divided by two, the first combinational circuit outputs one of the first parity value and the second parity value that is output by the second selector as the current parity value, and
when the remainder left when the number of bits at logic 1 in the state value to be output by the first combinational circuit is divided by two is different from the remainder left when the number of bits at logic 1 in one of the first state value and the second state value that is output by the first selector is divided by two, the first combinational circuit outputs a logically inverted value of one of the first parity value and the second parity value that is output by the second selector as the current parity value.

7. The semiconductor integrated circuit according to claim 5,
wherein the AND circuit functions as a parity error output circuit to output a parity error when the first parity error and the second parity error are output,
wherein after the first parity error and the second parity error are output, the first parity check circuit continues to output the first parity error and the second parity check circuit continues to output the second parity error.

8. The semiconductor integrated circuit according to claim 1, further comprising:
a second combinational circuit to output the first output signal based on the state value stored in the first flip-flop circuit; and
a third combinational circuit to output the second output signal based on the state value stored in the second flip-flop circuit,
wherein the third selector outputs the first output signal when the first parity error is not output but the second parity error is output, and outputs the second output signal when the first parity error is output but the second parity error is not output.

9. A method of processing in a semiconductor integrated circuit, the method comprising:
outputting a state value depending on an input signal and outputting a parity value of the state value from a first combinational circuit in the semiconductor integrated circuit;
storing the state value and the parity value output by the first combinational circuit in a first flip-flop circuit coupled to the first combinational circuit and outputting a first state value, a first parity value, and a first output value;

performing a parity check based on the state value and the parity value stored in the first flip-flop circuit and outputting a first parity error when detecting an error;

storing the state value and the parity value output by the first combinational circuit in a second flip-flop circuit coupled to the first combinational circuit in parallel with the first flip-flop circuit and outputting a second state value, a second parity value and a second output value;

performing a parity check based on the state value and the parity value stored in the second flip-flop circuit and outputting a second parity error when detecting an error;

allowing a selector to output the first state value to the first combinational circuit when the first parity error is not output but the second parity error is output;

allowing the selector to output the second state value to the first combinational circuit when the first parity error is output but the second parity error is not output; and allowing the first combinational circuit to output a current state value depending on the state value output by the selector and the input signal; wherein the selector includes
- a first selector that is coupled to the first flip-flop circuit, the second flip-flop circuit, and the first parity check circuit, selects one of the first state value and the second state value based on the first parity error output from the first parity check circuit and outputs a selected state value to the first combinational circuit,
- a second selector that is coupled to the first flip-flop circuit, the second flip-flop circuit, and the first parity check circuit, selects one of the first parity value and the second parity value based on the first parity error output from the first parity check circuit and outputs a selected parity value to the first combinational circuit,
- a third selector that is coupled to the first flip-flop circuit, the second flip-flop circuit, and the first parity check circuit and selects one of the first output value and the second output value based on the first parity error output from the first parity check circuit, and
- an AND circuit that is coupled to the first parity check circuit and the second parity check circuit and outputs a result of an AND operation of the first parity error and the second parity error.

10. The method according to claim 9, wherein when the first parity error and the second parity error are not output, the first selector outputs the first state value or the second state value to the first combinational circuit.

11. The method according to claim 9, wherein when the first parity error and the second parity error are output, the first selector outputs the first state value or the second state value to the first combinational circuit.

12. The method according to claim 9, wherein the second selector outputs the first parity value to the first combinational circuit when the second parity error is output, and outputs the second parity value to the first combinational circuit when the first parity error is output, and
wherein the first combinational circuit generates and outputs a current parity value based on one of the first parity value and the second parity value that is output by the second selector.

13. The method according to claim 12, wherein when a remainder left when a number of bits at logic 1 in the state value to be output by the first combinational circuit is divided by two is identical to a remainder left when the number of bits at logic 1 in one of the first state value and the second state value that is output by the first selector is divided by two, the first combinational circuit outputs one of the first parity value and the second parity value that is output by the second selector as the current parity value, and
when the remainder left when the number of bits at logic 1 in the state value to be output by the first combinational circuit is divided by two is different from the remainder left when the number of bits at logic 1 in one of the first state value and the second state value that is output by the first selector is divided by two, the first combinational circuit outputs a logically inverted value of one of the first parity value and the second parity value that is output by the second selector as the current parity value.

14. The method according to claim 12, wherein after the first parity error and the second parity error are continued to be output, the first parity check circuit outputs the first parity error and the second parity check circuit outputs the second parity error.

15. The method according to claim 9, further comprising:
outputting the first output signal based on the state value stored in the first flip-flop circuit by a second combinational circuit; and
outputting the second output signal based on the state value stored in the second flip-flop circuit by a third combinational circuit,
wherein the third selector outputs the first output signal when the first parity error is not output but the second parity error is output, and outputs the second output signal when the first parity error is output but the second parity error is not output.

* * * * *